US005165099A

United States Patent [19]

Onaya et al.

[11] Patent Number: 5,165,099

[45] Date of Patent: Nov. 17, 1992

[54] BALANCE CONTROL CIRCUIT

[75] Inventors: Masato Onaya, Maebashi; Tsutomu Ishikawa, Ota; Susumu Yamada, Ora, all of Japan

[73] Assignee: Sanyo Electric Co., Ltd., Osaka, Japan

[21] Appl. No.: 721,864

[22] Filed: Jun. 26, 1991

[30] Foreign Application Priority Data

Jun. 27, 1990 [JP] Japan ........ 2-168809
Jun. 29, 1990 [JP] Japan ........ 2-173381
Nov. 16, 1990 [JP] Japan ........ 2-311917

[51] Int. Cl.[5] ........ H04S 1/00; H03G 3/00

[52] U.S. Cl. ........ 381/1; 381/109; 333/17.1; 333/81 R; 307/264; 307/553; 307/562

[58] Field of Search ........ 381/1, 28, 108, 109; 379/409; 307/264, 553, 562; 333/81 R, 17

[56] References Cited

U.S. PATENT DOCUMENTS

| | | | |
|---|---|---|---|
| 4,123,626 | 10/1978 | Munter | 379/409 |
| 4,239,937 | 12/1980 | Kampmann | 381/28 |
| 4,503,554 | 3/1985 | Davis | 381/1 |
| 4,905,291 | 2/1990 | Strickland | 381/108 |
| 4,926,485 | 5/1990 | Yamashita | 381/28 |
| 5,046,107 | 9/1991 | Iwamatsu | 381/109 |

FOREIGN PATENT DOCUMENTS

| | | | |
|---|---|---|---|
| 60-097000 | 10/1983 | Japan . | |
| 59-10200A | 6/1984 | Japan . | |
| 0055451 | 2/1990 | Japan | 379/409 |

*Primary Examiner*—Forester W. Isen
*Attorney, Agent, or Firm*—Armstrong & Kubovcik

[57] ABSTRACT

The balance of the volumes in right and left channels in a stereo play back system is controlled. The amount of attenuation of an attenuator provided in each channel is controlled. When the levels of right and left stereo signals are judged to be approximately the same, an oscillator is permitted to oscillate and the pulses from the oscillator are counted by a counter. In accordance with a voltage signal which corresponds to the level ratio of the right and left stereo signals, whether the counter must count upwards or downwards is determined. The balance is controlled in accordance with the amount of attenuation of each attenuator which is determined in accordance with the decoded count value. The completion of the control is detected when the level ratio of the right and left stereo signals alternately change after they become substantially equal, and the control is automatically finished. When the control is finished, the counter is reset so as to facilitate balance control when the source of the stereo signals is changed.

12 Claims, 11 Drawing Sheets

| LSB | | | MSB |
|---|---|---|---|
| 1 | 1 | 1 | 1 |
| | | | |
| 0 | 1 | 0 | 1 |
| 1 | 0 | 0 | 1 |
| 0 | 0 | 0 | 1 |
| 1 | 1 | 1 | 0 |
| 0 | 1 | 1 | 0 |
| | | | |
| 0 | 0 | 0 | 0 |

UP

INITIAL VALUE

DOWN

Fig. 10

BALANCE CONTROL CIRCUIT

BACKGROUND OF THE INVENTION

1. Field of the Invention

The present invention relates to a balance control circuit for cancelling the unbalance between the aural signals from a plurality of channels.

2. Description of the Related Art

In a stereo system for transmitting the right and left stereo signals by using different channels, an unbalance is sometimes caused due to the nonuniformity in the circuit or element which constitutes each circuit. For example, it is necessary that the voice of an announcer is output at the same intensity from the right and left speakers and constantly assigned to the center of both speakers. However, if an unbalance is caused between the aural signals from the channels as described above, the signals are assigned to a position which deviates from the center to the right or left, so that the voice output is unpleasant to the ear.

To deal with this problem, a balance control circuit for balancing the aural signals from the right and left channels have conventionally been proposed and put to practical use. FIG. 1 shows such a conventional balance control unit. A left stereo signal input to a left input terminal 1 is output from a left output terminal 3 through a left attenuator 2. A right stereo signal input to a right input terminal 4 is output from a right output terminal 6 through a right attenuator 5. The levels of the left and right stereo signals at the left and right output terminals 3, 6 are detected and compared with each other by a detector 7. An output signal which corresponds to the difference in the levels of the left and right stereo signals is output from the output terminal of the detector 7. The output signal is held by a holding circuit 8 and supplied to a controller 9. The controller 9 receives the output signal and controls the amounts of attenuation of the left and right attenuators 2, 5. When left and right stereo signals which correspond to the voice of an announcer are input to the left and right input terminals 1, 4, left and light stereo signals having the same level must be output from the left and right output terminals 3, 6. If there is unbalance between the signals from both channels, however, the levels of the left and right stereo signals are not equal. For example, if the level of the left stereo signal is higher than that of the right stereo signal, an output signal having a level higher than a predetermined level is output from the detector 7 and supplied to the controller 9 through the holding circuit 8. The controller 9 then generates a control signal and controls the balance by increasing the amount of attenuation of the left attenuator 2. On the other hand, if the level of the left stereo signal is lower than that of the right stereo signal, the controller 9 supplies an output signal for increasing the amount of attenuation of the right attenuator 5. In this way, the signal levels on the left and right channels are balanced.

Each element of the balance control circuit shown in FIG. 1 is composed of an analog circuit, and the holding circuit 8 for holding the output signal of the detector 7 is essential. However, since the holding circuit 8 is composed of a capacitor 10 and resistors 11, 12, as shown in FIG. 1, it is impossible to hold the output signal of the detector 7 for a long time. In addition, when the level of the output signal of the detector 7 rapidly changes, since the capacitor 10 is rapidly charged or discharged, shock noise is disadvantageously produced.

As a player constituting a signal source for the stereo system, various players such as a compact disk player and a video disk player are used. The amount of unbalance between the signals from channels is different in players. The balance control device for the stereo system is therefore switched from one level to the corresponding level for the corresponding player. FIG. 2 shows such a conventional balance control device. By switching between first and second switches 21, 22 which operate in combination with each other, the output of a compact disk player 23 or a video disk player 24 is selectively supplied to a balance control circuit 25. The selected two signals are so controlled as to have the same level by the balance control circuit 25, so that the left and right stereo signals having the same level are obtained from a left output terminal 26 and a right output terminal 27.

In some cases, however, for example, when the video disk player 24 is changed over to the compact disk player 23 in the circuit shown in FIG. 2, the stereo system may be held in an ill balanced state for some time until the control by the balance control circuit 25 is started. The balance control circuit 25 shown in FIG. 2 is capable of the balance controlling operation only when a monophonic signal is applied thereto (in the case the right and left stereo signals input are equal to each other). The balance controlling operation is carried out not constantly but only intermittently in some sources. For example, in a video disk player for a motion picture which contains many human conversations, the control is frequently carried out, but in a compact disk player mainly for music, balance control is scarcely carried out. Therefore, if the switching operation between sources is carried out in the above-described way, the balance control circuit 25 sometimes may control the signal from the compact disk player 23 in accordance with the value used for controlling the video disk player 24.

SUMMARY OF THE INVENTION

Accordingly, it is an object of the present invention to eliminate the above-described problems in the related art and to accurately control the balance between the signals from channels.

It is another object of the present invention to simplify the composition of a balance control circuit.

To achieve this aim, the present invention provides a balance control circuit for controlling the balance between signals transmitted from at least two channels. The balance control circuit comprises: an attenuator disposed in each of the channels so as to attenuate the signal transmitted thereto with a variable amount of attenuation; a timing signal generator for generating a timing signal which determines the balance control period for the attenuation by the attenuator; an oscillator which operates in accordance with the timing signal; a counter for counting the output signals of the oscillator as clock pulses; a decoder for decoding the count value and supplying a signal for controlling the amount of attenuation to the attenuator; and a direction signal generator for generating a direction signal which determines whether the counter must count upwards or count downwards in order to determine in which attenuator the amount of attenuation is increased and in which attenuator the amount of attenuation is decreased, and supplying the direction signal to the counter.

According to the balance control circuit of the present invention, the timing signal starts the operation of the oscillator and determines the timing for balance control. The direction of control is determined in accordance with the direction signal. The counter counts the output signals of the oscillator as clock pulses and counts the clock pulses in the direction which is determined by the direction signal. The count value of the counter is decoded by the decoder and the amount of attenuation of the attenuator is controlled in accordance with the output signal of the decoder.

Since the balance control is carried out by digital processing, a balance control circuit which operates accurately by a simple composition is provided. Especially, since it is facilitated to hold data by digital processing, a holding circuit which uses a CR time constant is obviated, thereby enabling the long-time maintenance of a state and preventing shock noise from being produced.

The direction signal generator may include a level ratio signal generator for generating a signal having a level ratio proportional to the level ratio of the signals which are transmitted from the channels, and a comparator for comparing the output signal of the level ratio signal and a reference voltage.

The decoder outputs signals having the reverse phases from each other to a pair of attenuators. According to this composition, when the amount of attenuation in one of the attenuators is increased, the amount of attenuation in the other attenuator is decreased.

Each of the attenuators is preferably composed of a plurality of resistors which are connected in series between the signal path for transmitting the corresponding signal and the ground, and a plurality of gates for connecting one end of each resistor and the signal path. The gate is so controlled as to be opened or closed in accordance with the output of the decoder, thereby controlling the amount of attenuation.

The timing signal generator is preferably composed of a circuit for comparing the signals output from the attenuators and judging whether or not each signal is in a predetermined range.

It is preferable that the balance control circuit is further provided with a completion detector for detecting the end of balance control carried out by the control of the amounts of attenuation of the attenuators, and a controller for controlling the generation of the timing signal in accordance with the output signal of the completion detector.

The controller controls the generation of the timing signal in accordance with the output signal of the completion detector, thereby stopping the operation of the oscillator at an unnecessary time.

In this way, it is possible to provide a balance control circuit which can automatically stop the controlling operation after the end of the control.

In addition, according to the present invention, it is possible to provide a balance control circuit which is capable of automatically controlling the balance again when the balance is disturbed.

Furthermore, since it is possible to stop the oscillator when control is unnecessary, it is possible to prevent the generation of noise.

The completion detector preferably generates a control completion signal when the direction signal output is a repetition of alternate signals for upward and downward directions.

The controller is preferably composed of an unbalance signal generator for detecting a disturbance of the balance from the levels of the signals output from the plurality of attenuators and generating an unbalance signal, an OR gate to which the unbalance signal and the control completion signal are input so as to obtain the logical sum thereof, and an AND gate to which the output of the OR gate and the timing signal are input so as to obtain the logical product thereof.

It is preferable that the oscillation frequency of the oscillator preferably varies in accordance with the timing signal and that the counter is an up down type counter which starts to count from an intermediate value of the counting range and counts the output signals of the oscillator as clock pulses. The direction signal generator preferably detects the level of the output signal of each attenuator and generates a direction signal which determines whether the counter must count upwards or downwards. The direction signal generator preferably includes a direction judging circuit for judging whether the count value of the counter is obtained by counting upwards from the initial value or counting downwards from the initial value, and a switch for selecting either the output signal of the direction generator or the output signal of the direction judging circuit in accordance with the timing signal and supplying the selected signal to the counter as a signal which determines whether the counter must count upwards or downwards.

According to this composition, the oscillation frequency of the oscillator is lowered and the direction of counting of the counter is changed towards the initial value in accordance with the timing signal which indicates a non-controlling period and which is output from the timing signal generator. Since the initial value of the counter is set at an intermediate value of the counting range, it is possible to immediately judge whether the counter is counting upwards or downwards from the initial value only by seeing whether the most significant bit is "0" or "1". Therefore, the count value of the counter gradually changes toward the initial value. When the count value has returned to the initial value, the counting operation is stopped. The fact the count value has returned to the initial value is detected from a change in the value of the most significant bit. In this way, if the non-controlling period continues beyond a predetermined time, the balance control processing is stopped by a simple composition.

As described above, according to the present invention, the balance control circuit for automatically balancing the signals from the right and left channels makes the manipulated variables of the right and left attenuators equal when the non-controlling period continues beyond a predetermined time. Since the up down type counter is used and the initial value is set at an intermediate value of the counting range, it is possible to judge by a simple circuit whether the counter is counting upwards or downward and whether or not the count value has returned to the initial value.

The above and other objects, features and advantages of the present invention will become clear from the following description of the preferred embodiment thereof, taken in conjunction with the accompanying drawings.

BRIEF DESCRIPTION OF THE DRAWINGS

FIG. 10 shows the counting range of the counter in the embodiment shown in FIG. 9;

DESCRIPTION OF THE PREFERRED EMBODIMENTS

Figure 1:
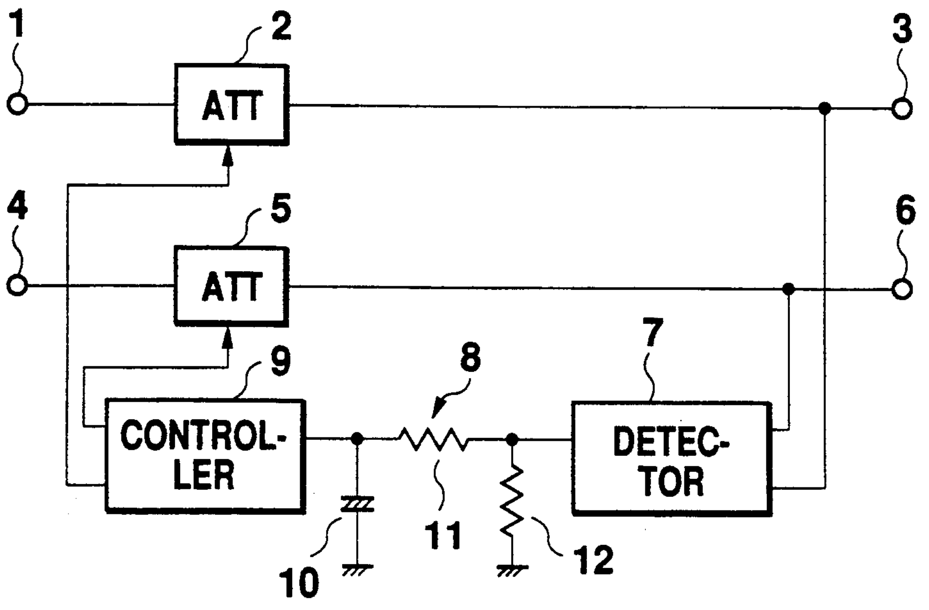
Fig. 1 PRIOR ART
FIG. 1 is a circuit diagram of a conventional balance control circuit.
Figure 2:
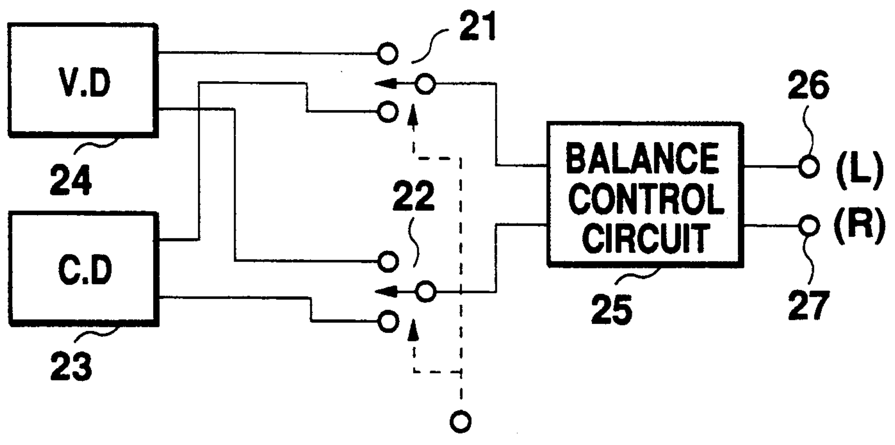
Fig. 2 PRIOR ART
FIG. 2 is a circuit diagram of a conventional balance control unit.
Figure 3:
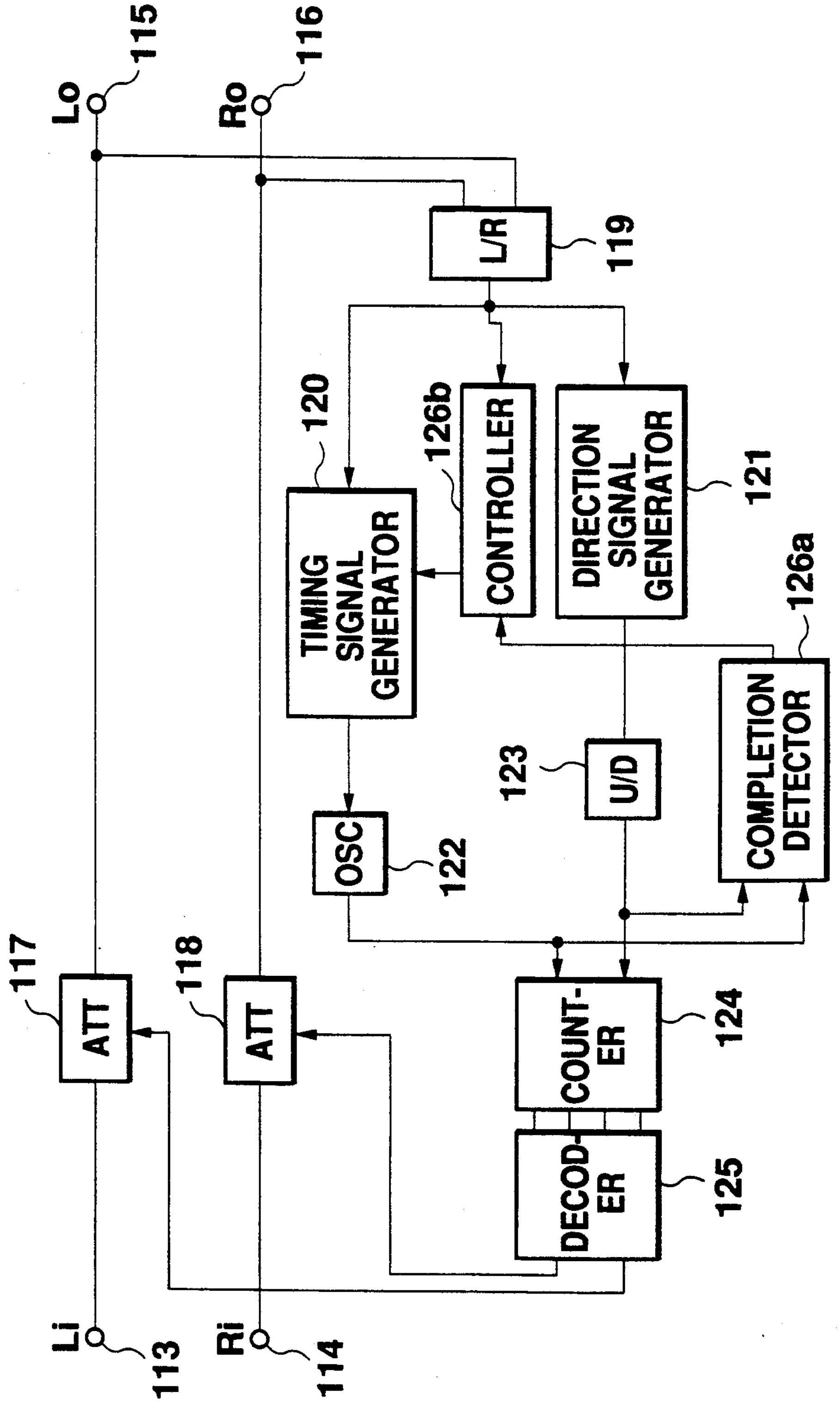
FIG. 3 is a circuit diagram of an embodiment of a balance control circuit according to the present invention.

FIG. 3 is a circuit diagram of an embodiment of a balance control circuit according to the present invention. A left stereo signal is input to a left input terminal 113 and output from a left output terminal 115. A right stereo signal is input to a right input terminal 114 and output from a right output terminal 116. A left attenuator 117 is inserted into a left transmission path (channel) 119 and a right attenuator 118 is inserted into a right transmission path (channel). An L/R signal generator 119 generates a signal which corresponds the level ratio of the left and right stereo signals obtained from the left and right output terminals 115, and a timing signal generator 120 generates a timing signal which determines a controlling period in accordance with the level of the output signal from the L/R signal generator 119. A direction signal generator 121 generates a direction signal which determines which of the left and right stereo signals is attenuated to a greater extent in accordance with the level of the output signal of the L/R signal generator 119. In accordance with the timing signal, an oscillator 122 outputs a clock pulse. An up/down signal generator 123 generates an up signal or a down signal in accordance with the direction signal. A counter 124 counts the output signals from the oscillator 122 as clock pulses in the direction which corresponds to the output signal of the up/down signal generator 123. The count value of the counter 124 is decoded by a decoder 125. A completion detector 126*a* detects the end of control on the basis of the output signal of the oscillator 122 and the output signal of the up/down signal generator 123. A controller 126*b* controls the generation of the timing signal in accordance with the output signal of the completion detector 126*a*.

In order to simplify explanation, three cases, namely, a first case in which only a left stereo signal is supplied to the left input terminal 113, a second case in which only a right stereo signal is supplied to the right input terminal 114, and a third case in which the right and left stereo signals are supplied to the left and right input terminals 113, 114 at substantially the same level (center signal) will be considered.

In the first case in which only a left stereo signal L is supplied to the left input terminal 113, the output signal of the L/R signal generator 119 which corresponds to the level ratio (L/R) of the left and right stereo signals is sufficiently high. The timing signal generator 120 judges the level of the output signal of the L/R signal generator 119 and when the level of the output signal is in a predetermined range (in the range which allows the signal to be regarded as a monophonic signal), the timing signal generator 119 outputs a signal of a high level (hereinunder referred to "[H]"), otherwise, it outputs a signal of a low level "hereinunder referred to "[L]"). Therefore, in the first case, the timing signal generator 120 generates an output signal of [L] and the oscillator 122 does not start its operation. Consequently, the counter 124 does not count and the left and right attenuators 117, 118 maintain the inoperative state.

In the second case in which only a right stereo signal R is supplied to the right input terminal 114, the output signal of the L/R signal generator 119 is sufficiently low. Therefore, the oscillator 122 does not start its operation, the counter 124 does not count, and the left and right attenuators 117, 118 maintain the inoperative state in the same way as in the first case.

In the third case in which right and left stereo signals are supplied to the left and right input terminals 113 and 114 at substantially the same level, the output signal of the L/R signal generator is in the predetermined range and the output signal of the timing signal generator 119 is [H]. The oscillator 122 therefore starts to oscillate. The direction signal generator 121 is provided with a power source having a predetermined reference voltage $V_{ref}$ and compares the level $V_1$ of the output signal of the L/R signal generator 119 with the reference voltage $V_{ref}$. If $V_1 > V_{ref}$, the output of the direction signal generator 121 is [H], while if $V_1 < V_{ref}$, it generates a signal of [L]. The up/down signal generator 123 outputs an up signal in accordance with the output of [H] of the direction signal generator 121 and a down signal in accordance with the output of [L]. If the output of the direction signal generator 121 is [H], the up/down signal generator 123 generates an up signal, and the counter 124 counts the output signals of the oscillator 122 as clock pulses in the upward direction in accordance with the up signal. If the output of the direction signal generator 121 is [L], the up/down signal generator 123 generates a down signal, and the counter 124 counts the output signals of the oscillator 122 in the downward direction. The decoder 125 serially decodes the count values of the counter 124 and drives the left and right attenuators 117, 118. In this way, when the level of the output signal of the L/R signal generator 119 is in a predetermined range which is higher than the reference voltage $V_{ref}$, the counter 124 counts the clock pulses from the oscillator 122 in the upward direction. In accordance with the output of the decoder 125, the amount of attenuation of the left attenuator 117 is increased, while the amount of attenuation of the right attenuator 118 is decreased so as to make the levels of the left and right stereo signals L, R equal. On the other hand, when the level of the output signal of the L/R signal generator 119 is in a predetermined range which is lower than the reference voltage $V_{ref}$, the counter 124 counts the clock pulses from the oscillator 122 in the downward direction. In accordance with the output of the decoder 125, the amount of attenuation of the left attenuator 117 is decreased, while the amount of attenuation of the right attenuator 118 is increased so as to make the levels of the left and right stereo signals L, R equal.

When the control is finished, the L/R signal generator 119 alternately outputs a signal slightly higher than the reference voltage $V_{ref}$ and a signal slightly lower than the reference voltage $V_{ref}$. Therefore, the direction signal generator 121 alternately generates an up signal and a down signal, so that the counter 124 alternately counts upwards and downwards. The completion detector 126*a* detects this state indicating that the control has been finished, and outputs a completion signal.

The controller 126*b* forcibly inhibits the generation of a timing signal in accordance with the completion signal. The oscillation of the oscillator 122 is thereby stopped and the counting operation of the counter 124 is also stopped. The decoder 125 and the left and right attenuators 117, 118 maintain the state at the time of completion.

If the balance between the right and left stereo signals in the completed state is disturbed for some reason, the controller 126*b* is reset and the operation of the timing signal generator 120 is resumed. If the balance between the right and left stereo signals is disturbed and an output signal having a comparatively high level in a predetermined range which allows the generation of a timing signal from the timing signal generator 120 is generated from the L/R signal generator 119, the controller 126*b* stops generating a signal for inhibiting the generation of a timing signal. The timing signal generator 120 and the direction signal generator 121 are operated so as to resume the balance control. Thus, by using the circuit shown in FIG. 3, it is possible to control the balance between the signals from the channels, maintain the balanced state when the control is finished and resume the control when the balance is disturbed.

Figure 4:
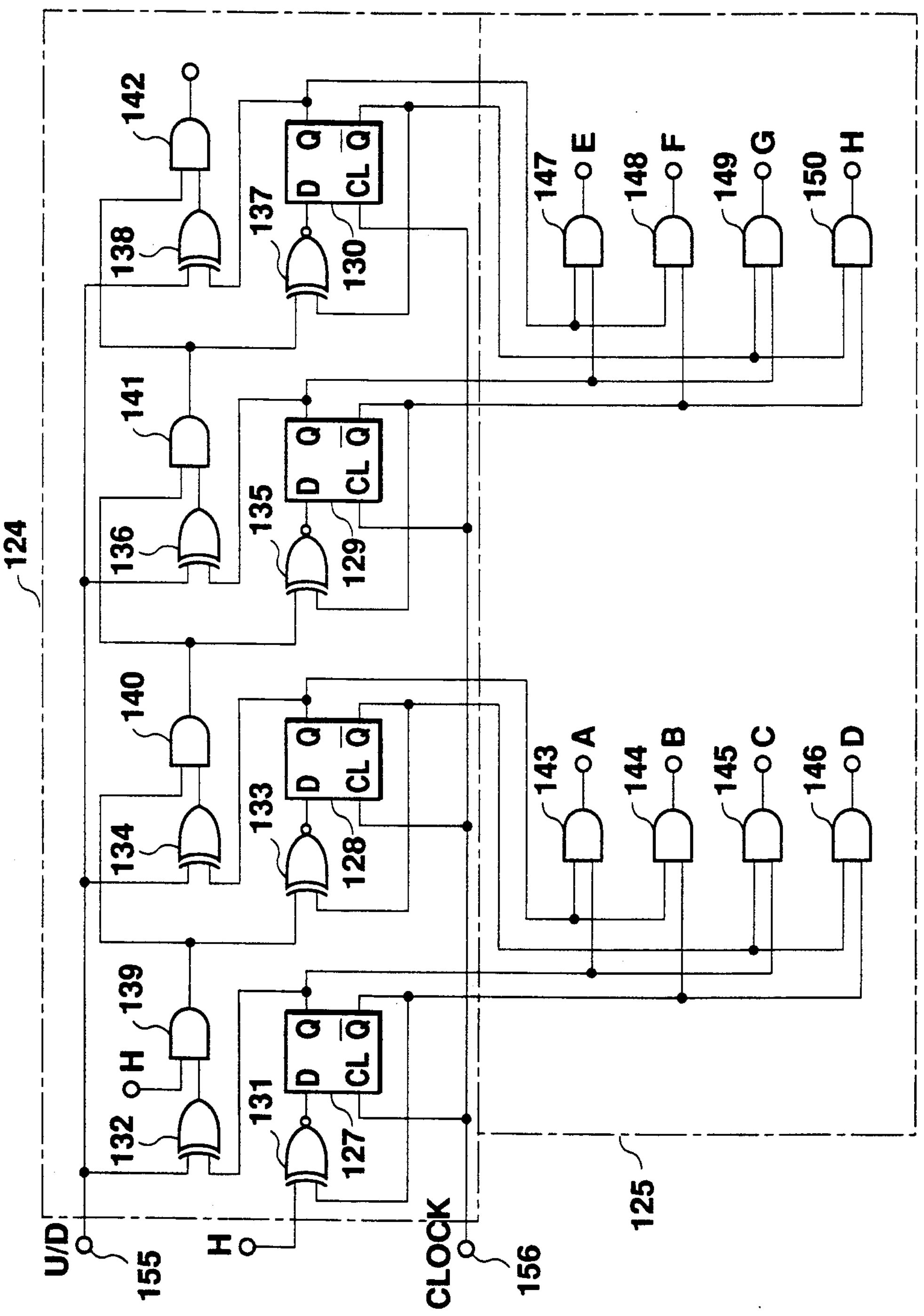
FIG. 4 is a circuit diagram of an example of the composition of the counter and the decoder in the embodiment shown in FIG. 3.

FIG. 4 shows an example of the composition of the counter 124 and the decoder 125 in the embodiment shown in FIG. 3. In FIG. 4, the counter 124 is composed of an up down type counter including four D-FF's 127 to 130, eight exclusive OR gates 131 to 138, and four AND gates 139 to 142. The decoder 125 is composed of first to fourth AND gates 143 to 146 and fifth to eighth AND gates 147 to 150.

Figure 5:
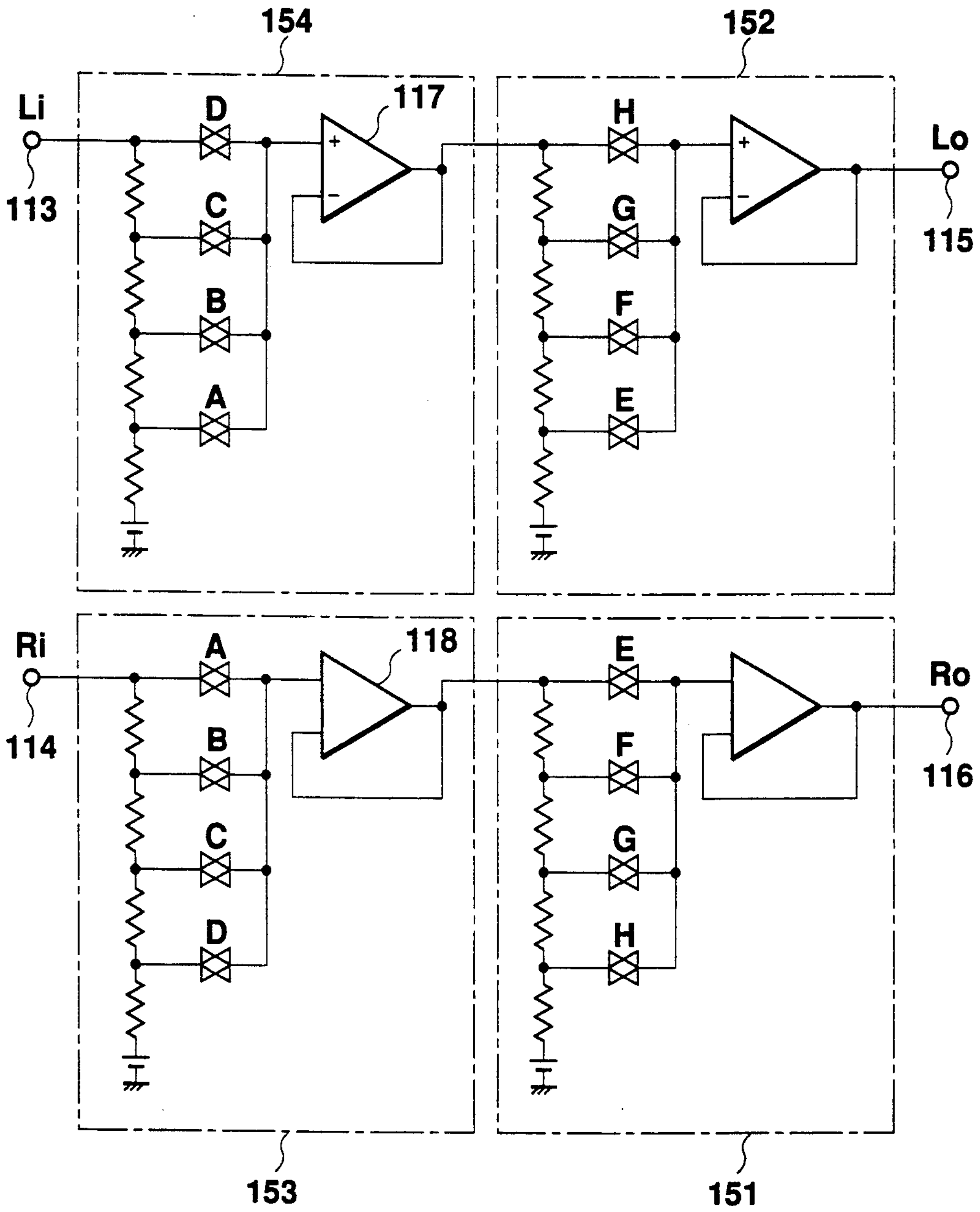
FIG. 5 is a circuit diagram of an example of the composition of the attenuators in the embodiment shown in FIG. 3.

FIG. 5 shows an example of the composition of the left and right attenuators 117, 118. The left attenuator 117 is composed of a first left attenuator 151 including four resistors and four gates, and a second left attenuator 152 having a similar composition. The right attenuator 118 is composed of a first right attenuator 153 and a second right attenuator 154, each having a similar composition to that of the first left attenuator 151.

In FIGS. 4 and 5, the output A of the first AND gate 143 opens the gates A of the first left attenuator 151 and the first right attenuator 153, and the outputs B to H are also connected so as to open the corresponding gates in FIG. 5.

In FIGS. 4 and 5, if all the outputs Q of the D-FF 127 to 130 are [0], in other words, the count value of the counter 124 is (0,0,0, 0), the balance control circuit is in the initial state. In this state, the outputs D and H are generated from the fourth and eighth gates 146, 150, respectively, thereby opening the gates D and H. When a first clock pulse is supplied to a clock input terminal 156 in the state in which the up signal of [L] is input to an up down input terminal 155, the count value of the counter 124 indicates (1, 0, 0, 0) and the output C is generated by the third AND gate 145, thereby opening the gates C. The left input signal $L_i$ is therefore slightly attenuated and the amount of attenuation of the right input signal $R_i$ becomes small. With proceeding of the counting operation of the clock pulses, the gates which are to be opened are sequentially switched. When 16 clock pulses are supplied, the outputs A, E of the first and fifth AND gates 143, 147 are generated so as to open the gates A and E, and the left input signal $L_i$ is attenuated to the greatest extent, while the right input signal $R_i$ is not attenuated at all. In the actual circuit operation, there is a strong possibility of the output of the comparator 122 shown in FIG. 3 being inverted in the middle of the process so as to count in the opposite direction.

The same weight is applied to the first left attenuator 151 and the first right attenuator 153. For example, the outputs A, B, C and D become 0, −1, −2 and −3, respectively. Similarly, the same weight is applied to the second left attenuator 152 and the second right attenuator 154. For example, the outputs E, F, G and H become 0, −4, −8 and −12, respectively. When the down signal of [H] is input to the up down input terminal 155, the counter 124 counts downwards such that the count value proceeds from (1,1,1,1) to (0,1,1,1) . . . and the corresponding gates are opened. Although the initial value of the counter 124 is set when the amount of attenuation of one attenuator reaches its maximum and the amount of attenuation of the other attenuator is zero in FIGS. 4 and 5, the initial value may be set when the amounts of both attenuators are the same intermediate value so that the amounts of attenuation of the right and left attenuators change in the opposite directions in accordance with the output of the decoder.

Figure 6:
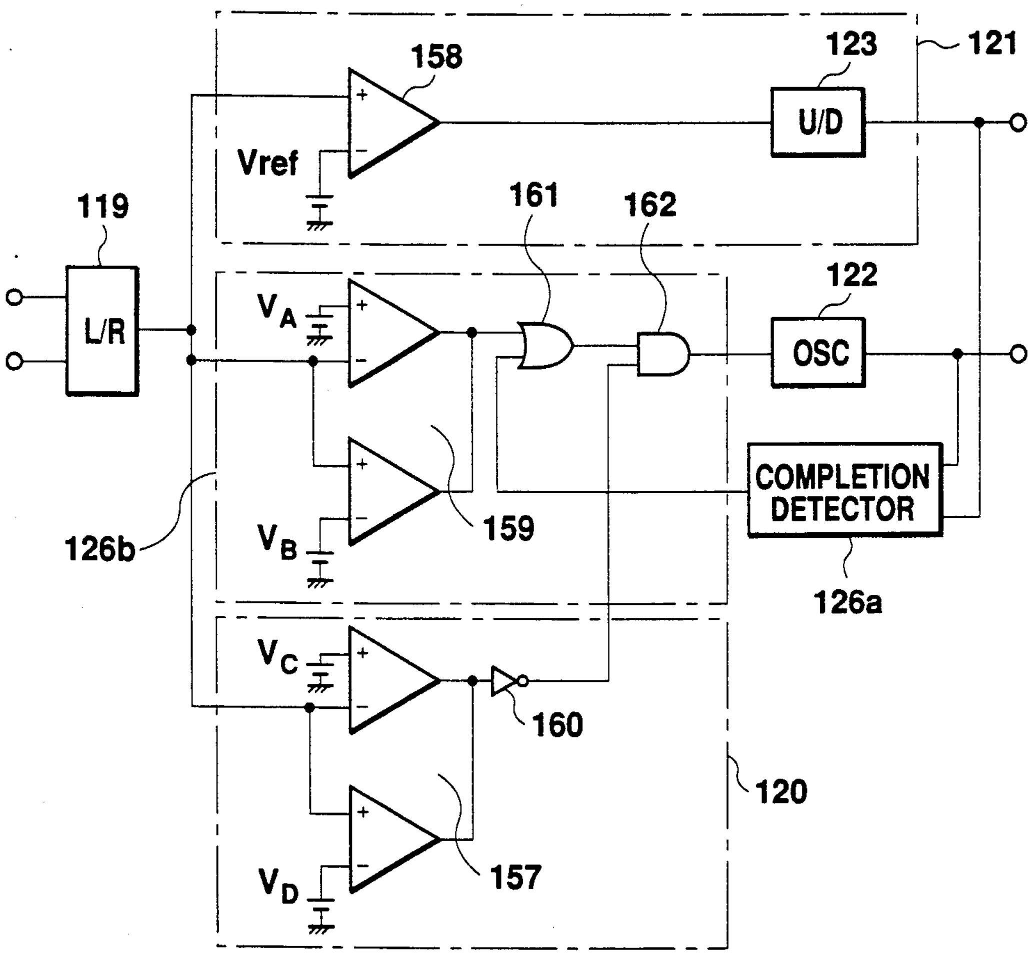
FIG. 6 is a circuit diagram of an example of the composition of the direction signal generator, timing signal generator and controller in the embodiment shown in FIG. 3.

FIG. 6 shows an example of the composition of the timing signal generator 120, the direction signal generator 121 and the controller 126*b* in the embodiment shown in FIG. 3. In FIG. 6, the output signal of the L/R signal generator 119 is supplied to a first window comparator 157 which acts as the timing signal generator, a comparator 158 which acts as the direction signal generator, and a second window comparator 159 which constitutes a part of the controller. The first window comparator 157 has reference voltages $V_C$ and $V_D$ ($V_C<V_D$) and when the output voltage $V_1$ of the signal generator 119 satisfies the relationship $V_D<V_1$ or $V_C>V_1$, the first window comparator 157 outputs a signal of [H], and when $V_C<V_1<V_D$, the first window comparator 157 outputs a signal of [L]. Therefore, the first window comparator 157 outputs a signal of [L] in a range in which the levels of the left and right stereo signals L, R are substantially equal, and the output of [L] is supplied to the oscillator 122 as a timing signal through an inverter 160. The comparator 158 has a reference voltage $V_{ref}$, and when the output of the L/R signal generator 119 is smaller than $V_{ref}$, the comparator 158 outputs a signal of [H], while when the output of the L/R signal generator 119 is larger than $V_{ref}$, the comparator 158 outputs a signal of [L]. The output signal of [H] or [L] is supplied to the up/down signal generator 123, and the up/down signal generator 123 generates an up signal in accordance with the output signal of [H] and a down signal in accordance with the output signal of [L]. The controller **126*b* is composed of a second window comparator 159, an OR gate 161 and an AND gate 162. The second window comparator 159 has reference voltages $V_A$ and $V_B$ ($V_A<V_B$, $V_B<V_D$, $V_A>V_C$), and when the output voltage $V_1$ of the signal generator 119 satisfies the relationship $V_B<V_1$ or $V_A>V_1$, the second window comparator 159 outputs a signal of [H], while when $V_A<V<V_B$, the second window comparator 159 outputs a signal of [L]. The output of the second window comparator 159 and the output of the completion detector 126*a* are supplied to the OR gate 161, and when either of the outputs is [H], the OR gate outputs a signal of [H]. The output of the OR gate 161 and the inverted output of the first window comparator 157 are supplied to the AND gate 162, and when both outputs are [H], the AND gate outputs a signal of [H] so as to drive the oscillator 122**.

At the start of balance control, the output of the completion detector **126*a* is [H], and the output of the OR gate 161 is also [H]. The oscillator 122 is therefore driven by the output of the first window comparator 157 which acts as the timing signal generator. When the balance controlling operation is finished, the completion detector 126*a* outputs a completion signal of [L] and the output of the OR gate 161 also becomes [L]. The output of the AND gate 162 therefore becomes [L], whereby the oscillating operation of the oscillator 122 is stopped. In this way, the state at the time of completion of control is maintained. If a signal $V_2$ which satisfies the relationship $V_B<V_2$ or $V_A>V_2$ is output from the L/R signal generator 119 in the state in which balance control is finished, the second window comparator 159 outputs a signal of [H] and the output of the OR gate 161 also becomes [H]. The AND gate 162 therefore outputs a signal of [H] in accordance with the inverted output of the first window comparator 157, whereby the oscillator 122** is driven. In this way, when an unbalance is caused for some reason after the end of balance control, it is possible to resume balance control.

Figure 7:
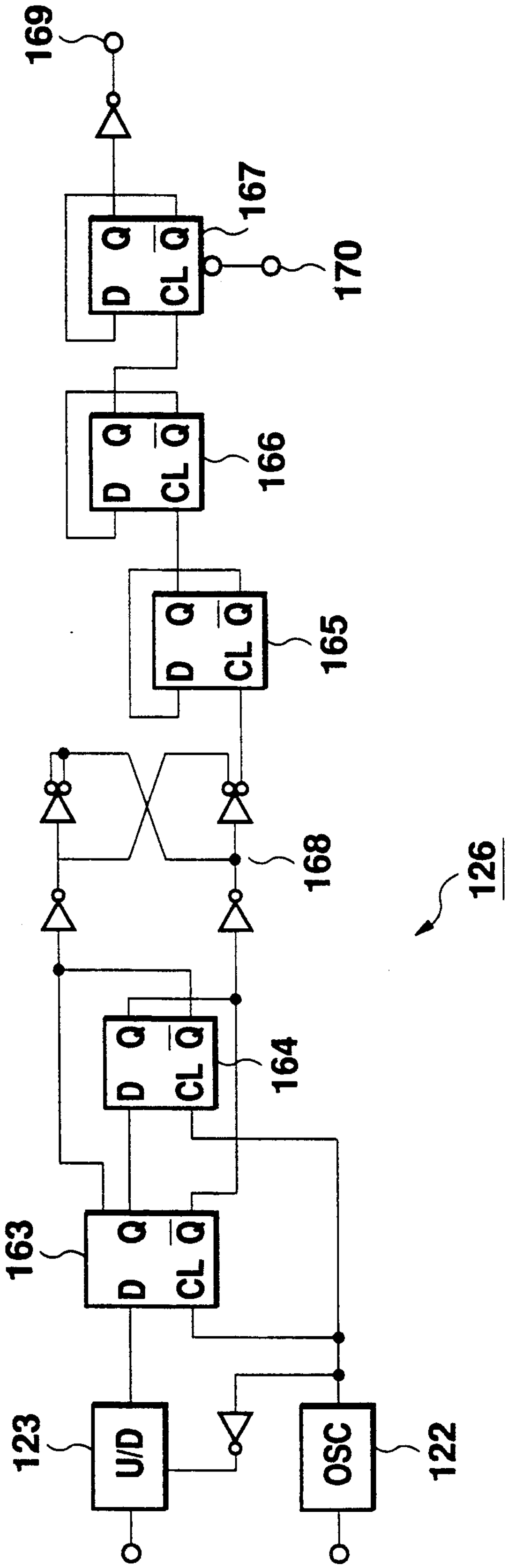
FIG. 7 is a circuit diagram of an example of the composition of the completion detector in the embodiment shown in FIG. 3.

FIG. 7 shows an example of the composition of the completion detector **126*a* shown in FIGS. 3 and 6. In FIG. 7, the output of the up/down signal generator 123 is supplied to the clock input terminal of a first D-FF 163 as a clock pulse. Second to fourth D-FF's 164 to 167 process the signal and an output signal indicating that the control has been finished is output from an output terminal 169. Before the end of control, the output signal of the up/down signal generator 123 is a monotone signal of [H] or [L], and when the control has been finished, the alternate signals of [H] and [L] are repeatedly output. The completion detector 126*a* shown in FIG. 7 detects the repeatedly output signals of [H] and [L] and the output signal at the output terminal 169** is switched from the signal of [H] to a signal of [L].

Figure 8:
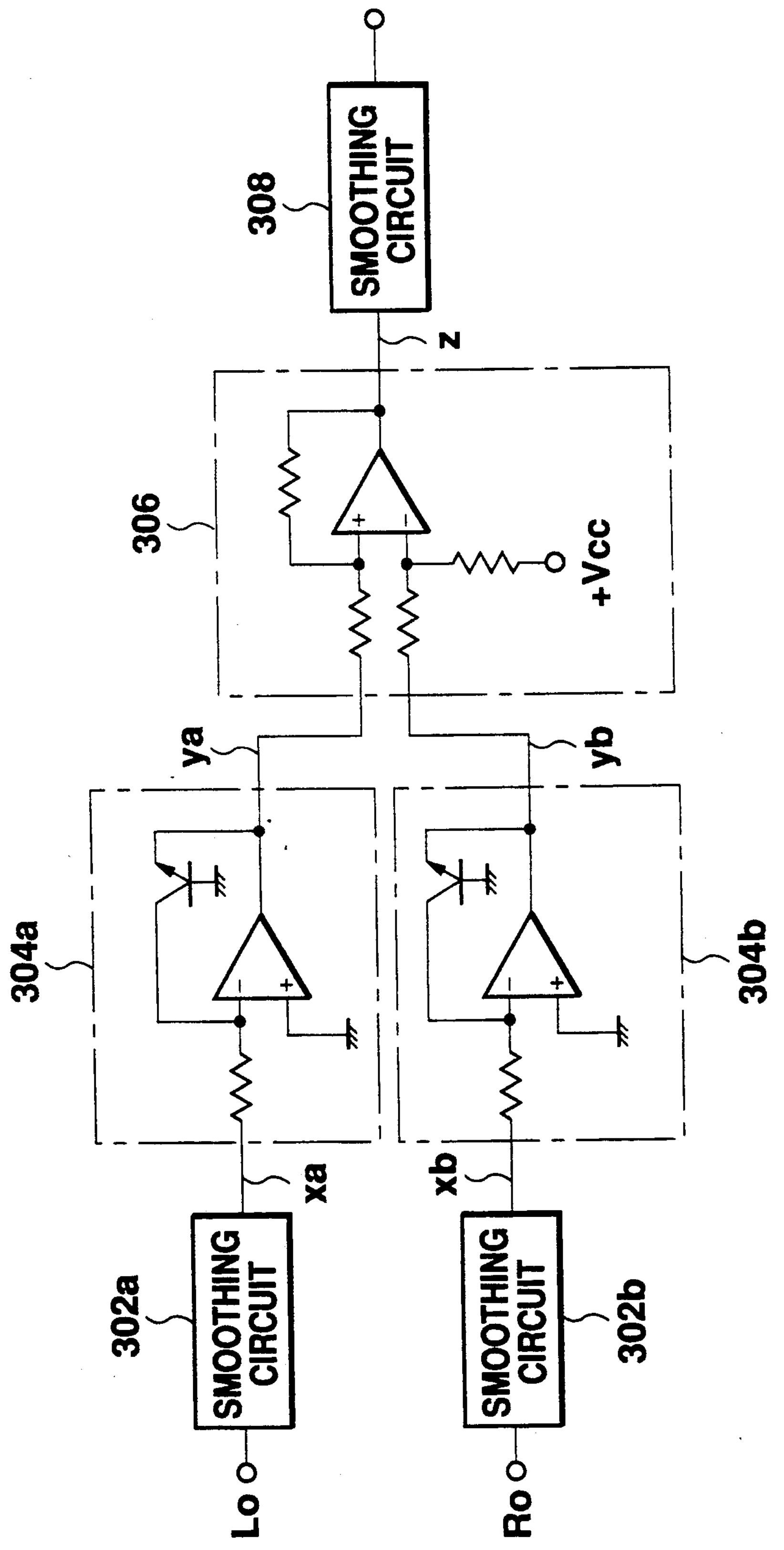
FIG. 8 is a circuit diagram of an example of the composition of the L/R signal generator in the embodiment shown in FIG. 3.

FIG. 8 shows the composition of the L/R signal generator 119. The L/R signal generator 119 is composed of smoothing circuits **302*a*, 302*b* to which the signals Lo, Ro output from the output terminals 115, 116, respectively, are input, logarithmic amplifiers 304*a*, 304*b* to which the signals from the smoothing circuits 302*a*, 302*b* are input, a subtracter 306 to which the signals from the logarithmic amplifiers 304*a*, 304*b* are input, and a smoothing circuit 308 to which the output signal of the subtracter 306** is input.

After the signals $L_o$, $R_o$ are smoothed by the smoothing circuit **302*a*, 302*b*, they are logatrithmically amplified by the logarithmic amplifiers 304*a*, 304*b*. If it is assumed that the inputs of the logarithmic amplifiers 304*a*, 304*b*** are xa, xb and the outputs thereof are ya, yb, they have the following relationship:

$$ya=\log e\ xa,\ yb=\log e\ xb$$

wherein e is a base of a natural logarithm.

The subtracter 306 obtains the difference between ya and yb, and the outputs z. The output z is represented as follows:

$$z=\log e\ xa-\log e\ xb=\log e\ xa/xb$$

If xa=xb, z=log e 1=0, xa>xb, z>0, and xa<xb, z<0.

The output of the subtracter 306 when z=0 is set at $V_{cc}/2$ and the output is smoothed by the smoothing circuit 308 so as to generate a comparison output showing a gentle change.

In this way, the L/R signal generator 119 outputs a signal having a voltage corresponding to the ratio of the left and right stereo signals $L_o$, $R_o$.

Figure 9:
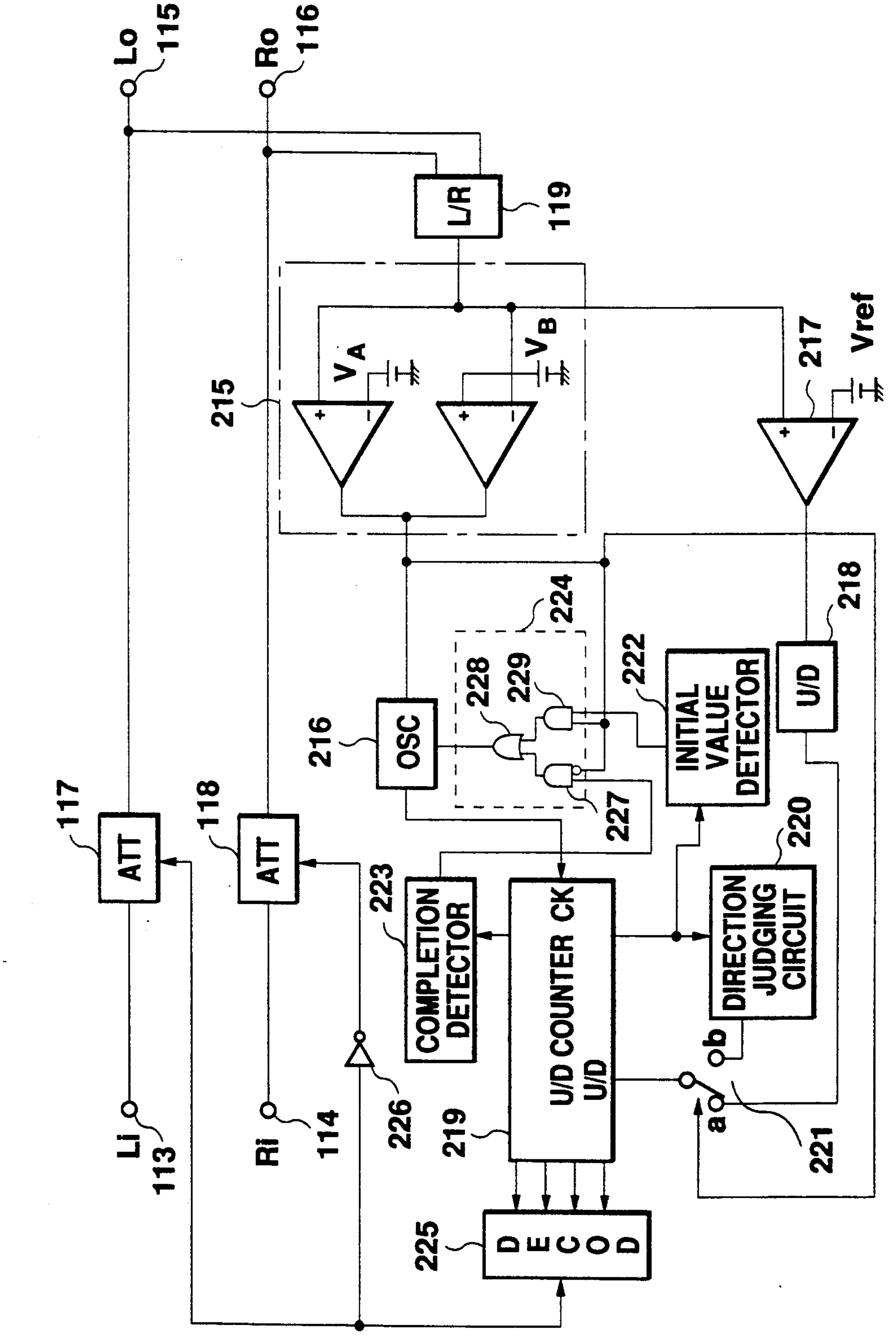
FIG. 9 is a circuit diagram of another embodiment of a balance control circuit according to the present invention.

FIG. 9 is a circuit diagram of another embodiment of a balance control circuit according to the present invention. The same reference numerals are provided for the elements which are the same as those in the embodiment shown in FIG. 3, and explanation thereof will be omitted.

A judging circuit 215 judges whether or not the level of the output signal from the L/R signal generator 119 is in a predetermined range and has a similar composition to that of the timing signal generator 120 in FIG. 3. An oscillator 216 changes the oscillation frequency in accordance with the timing signal from the judging circuit 215. A comparator 217 has a similar composition to that of the direction signal generator 121 in FIG. 3 and supplies a direction signal to an up/down signal generator 218. The up/down signal generator 218 has a similar composition to that of the up/down signal generator 123 in FIG. 3. An up/down type counter 219 counts the output signals of the oscillator 216 as clock pulses with an intermediate value (0,0,0,1) in the counting range as the initial value. A direction judging circuit 220 judges whether the up/down type counter 219 is counting upwards or downwards from the initial value by seeing whether the most significant bit of the count value is "0" or "1", and a switch 221 selects the output signal of the direction judging circuit 220 in accordance with the output of the judging circuit 215 and supplies the selected signal to the counter 219 as an up or down signal. An initial value detector 222 detects that the count value has returned to the initial value by detecting a change of the most significant bit of the count value of the counter 219 from "0" to "1". A completion detector 223 detects the completion of the counting operation after the counting operations for balance control in accordance with the up/down signal from the counter 219. A selecting circuit 224 selects the output signal of the initial value detector 222 or the output of the completion detector 223 in accordance with the output of the judging circuit 215 and supplies the selected signal to the oscillator 216 as an oscillation stop signal. A decoder 225 decodes the count value of the counter 219.

If it is assumed that a video disk player is used as the source for the balance control circuit shown in FIG. 9 and a monophonic signal is applied thereto, the levels of the right and left stereo signals are substantially equal. The value of the output signal of the L/R signal generator 119 is set at a value in the vicinity of the reference voltage $V_{ref}$, and the reference voltage $V_A$ of the judging circuit 215 is set at a value larger than the reference voltage $V_{ref}$ by a predetermined value. The judging circuit 215 generates an output signal of [H] when the input signal of the judging circuit 215 is larger than $V_A$ or smaller than $V_B$ and generates an output signal of [L] when the input signal thereof is intermediate between $V_A$ and $V_B$. If the output signal of the judging circuit 215 is [L], the oscillator 216 starts to oscillate at a first frequency (high frequency) and supplies the output signal to the counter 219 as a clock pulse. The output signal of the L/R signal generator 119 is also supplied to a comparator 217 and compared with the reference voltage $V_{ref}$.

If the output signal of the L/R signal generator 119 is larger than the reference voltage $V_{ref}$, the output of the comparator 217 becomes [H], so that an up signal is generated from the up/down signal generator 218. In accordance with the output signal of [L] from the judging circuit 215, the switch 221 is connected to the a side, so that the up signal is applied to the counter 219. The counter 219 therefore counts the output signals of the oscillator 216 as clock pulses in the upward direction.

On the other hand, if the output signal of the L/R signal generator 119 is smaller than the reference voltage $V_{ref}$, the output of the comparator 217 becomes [L] and the counter 219 counts downwards in accordance with the down signal generated from the up/down signal generator 218.

The counter 219 is composed of, for example, 4 bits, and the counting range is as shown in FIG. 10. The intermediate value of the counting range is the value obtained when "1" is first generated at the most significant bit (hereinunder referred to as "MSB"), and this intermediate value is set at the initial value of the counter 219. If the counter 219 counts upwards from the initial value, the maximum output is (1, 1, 1, 1). On the other hand, if the counter 219 counts downwards from the initial value, the minimum output is (0, 0, 0, 0).

The decoder 225 serially decodes the count values of the counter 219 and drives the left attenuator 117 and the right attenuator 118. At this time, since the output signal of the decoder 225 is directly applied to the left attenuator 117 but allied to the right attenuator 118 through an inverter 226, the left and right attenuators 117, 118 are controlled in the opposite directions. If the level of the left output signal is higher than the level of the right output signal, the counter 219 counts upwards, the amount of attenuation of the left attenuator 117 being thereby increased while the amount of attenuation of the right attenuator 118 being decreased. On the other hand, if the level of the left output signal is lower than the level of the right output signal, the counter 219 counts downwards, the amount of attenuation of the left attenuator 117 being thereby decreased while the amount of attenuation of the right attenuator 118 being increased.

The oscillator 216 continues to oscillate at a first frequency while the output signal $V_X$ of the L/R signal generator 119 is in the range of $V_A > V_X > V_B$. The decoder 225 serially decodes the count values of the counter 219 and controls the left and right attenuators 117, 118 so as to maintain the balance while the oscillator 216 is oscillating. The counter 219 has a function of a limiter which inhibits the counting operation of the counter 219 when the count value reaches a predetermined value. When the levels of the left and right stereo signals at the left and right output terminals 115, 116 are reversed in accordance with the control of the left and right attenuators 117, 118, the direction of counting of the counter 219 is also reversed, and similar attenuating operation is continued.

The counter 219 repeats the counting operations in the reverse directions (counts in the reverse direction when the count value reaches a predetermined value) on the basis of the balance controlling operation. When the completion detector 223 detects the repetition of the reverse operations, it outputs a detection signal indicating that the balance control has been finished and supplies the detection signal to the selecting circuit 224. The selecting circuit 224 has opened a first AND gate 227 in accordance with the output signal of [L] from the judging circuit 215. Therefore, the detection signal of the completion detector 223 is supplied to the oscillator 216 through the first AND gate 227 and the OR gate 228 as an oscillation stop signal. The oscillator 216 immediately stops oscillating, and the counter 219 thereby stops counting. On the basis of the count value at the current time, the decoder 225 continues to attenuate the left and right attenuators 117, 118.

If it is now assumed that the source is switched to a compact disk player in this state and that the levels of the right and left stereo signals have greatly changed and the output signal $V_X$ has exceeded the range of $V_A > V_X > V_B$, the output signal of the judging circuit 215 becomes [H] and the oscillator 216 oscillates at a second frequency (low frequency). The output signal of the oscillator 216 is supplied to the counter 219 as a clock pulse. The switch 221 is connected to the b side in FIG. 9 in accordance with the signal of [H] and the direction judging circuit 220 is selected. The direction judging circuit 220 judges whether the counter 219 is counting upwards or downwards from the initial value and supplies an up/down signal in the direction opposite to the current direction of counting (in the direction in which the count value of the counter 219 is returned to the initial value) to the switch 221. Since the initial value is set at (0, 0, 0, 1), it is easy to judge whether the direction is upwards or downwards. Referring to FIG. 10, the MSB is constantly "1" when the counter 219 is counting upwards and constantly "0" when the counter 219 is counting downwards. Therefore, if the MSB is "1", a down signal is supplied to the counter 219, while if the MSB is "0", an up signal is supplied to the counter 219.

As a result, the count value of the counter 219 gradually (because the frequency of the clock signal is low) returns to the initial value and simultaneously the decoder 225 gradually makes the amounts of attenuation of the left and right attenuators 117 equal.

When the count value of the counter 219 returns to the initial value, the initial value detector 222 detects this. It is also easy to detect that the count value has returned to the initial value because the initial value of the counter 219 is set at (0, 0, 0, 1). Referring to FIG. 10, when the counter 219 counts towards the initial value from the state of counting downwards, the MSB changes from "0" to "1", and when the counter 219 counts towards the initial value from the state of counting upwards, the MSB also changes from "0" to "1". When the counter 219 counts towards the initial value from the state of counting upwards, after the count value reaches (1, 1, 1, 0), it is reversed to "0, 0, 0, 1". Therefore, by detecting that the MSB has changed from "0" to "1", it is possible to detect that the count value has returned to the initial value.

At this time, since the signal of [H] has been supplied to the selecting circuit 224 from the judging circuit 215, a second AND gate 229 is open. Therefore, the detection signal of the initial value detector 222 is supplied to the oscillator 216 through the second AND gate 229 and the OR gate 228 as an oscillation stop signal. The oscillator 216 then stops oscillating. Since no clock pulse is supplied to the counter 219, the counter 219 also stops counting and holds the initial value.

Consequently, the left and right attenuators 117, 118 hold the equal amount of attenuation and exerts no influence on the balance between the left and right input signals from the source.

Figure 11:
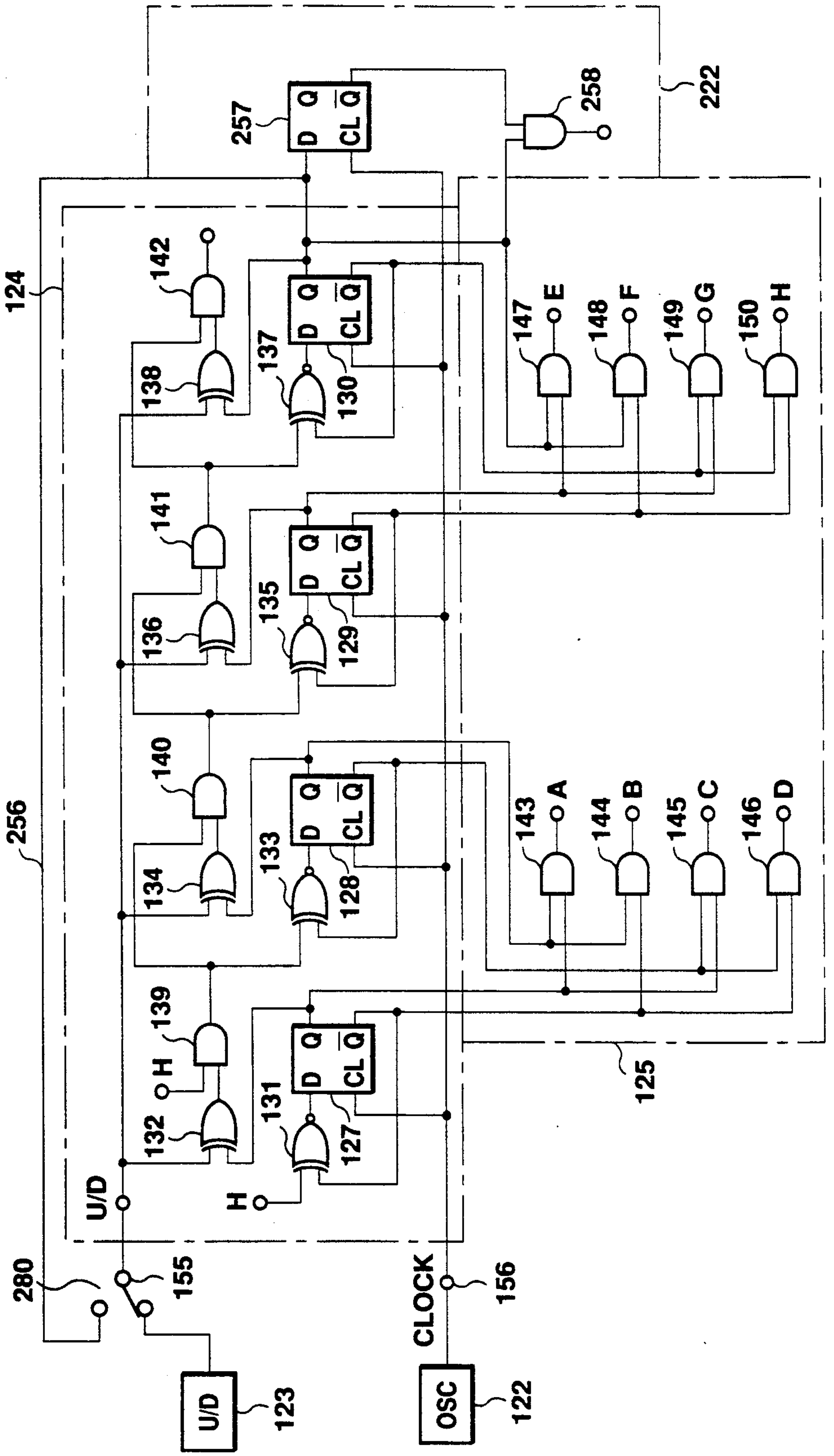
FIG. 11 is a circuit diagram of an example of the composition of the counter, decoder, direction judging circuit and initial value detection in the embodiment shown in FIG. 9.

FIG. 11 shows an example of the composition of the counter 219, decoder 225, direction judging circuits 220 and initial value detector 222 shown in FIG. 9.

In FIG. 11, the counter 219 and the decoder 225 have similar compositions to those shown in FIG. 4.

The direction judging circuit 220 is indicated by a connection 256 which supplies the output Q of the D-FF 130 to a switch 280.

Figure 12:
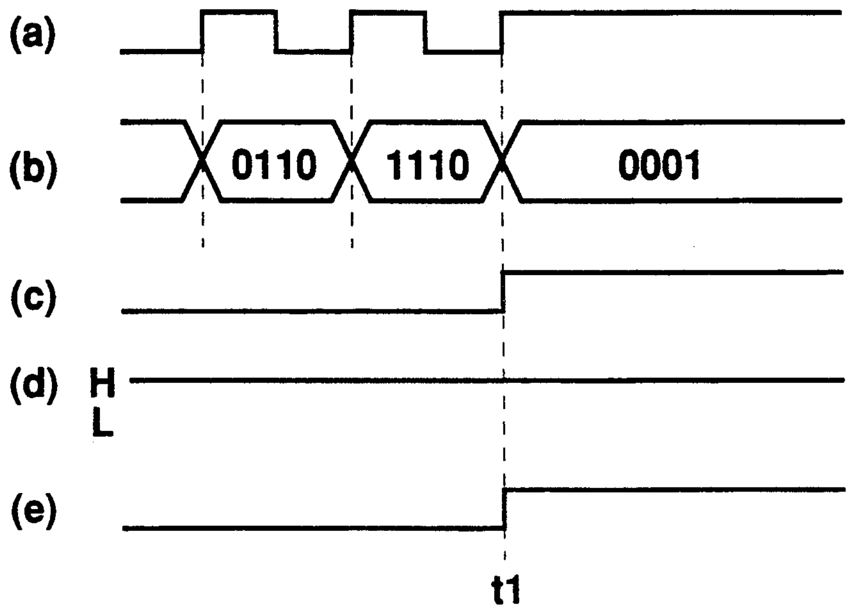
FIGS. 12(*a*) to 12(*e*) and FIGS. 13(*a*) to 13(*e*) show waveforms explaining the circuit diagram shown in FIG. 11.
Figure 13:
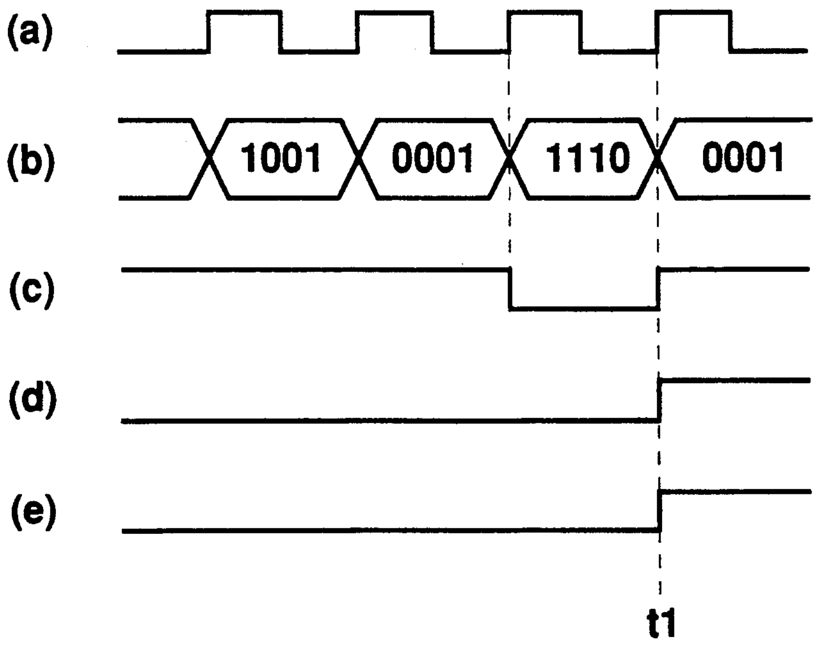

The initial value detector 222 is composed of the D-FF 130, a D-FF 257 and an AND gate 258. If it is assumed that a clock signal shown in FIG. 12(*a*) is supplied to the clock input terminal 156 in FIG. 11, the counter 219 counts towards the initial value from the state of counting downwards, and the count value of the D-FF's 127 to 130 approaches the initial value, as shown in FIG. 12(*b*), the output Q of the D-FF 130 rises in correspondence with the clock signal at time $t_1$, as shown in FIG. 12(*c*). Since the output Q of the D-FF 257 maintains [H], as shown in FIG. 12(*d*), the output of the AND gate 258 rises in correspondence with the rise of the signal in FIG. 12(*c*), as shown in FIG. 12(*e*), whereby the fact that the count value has returned to the initial value is detected. FIGS. 13(*a*) to 13(*e*) show the waveforms which explain that the counter 219 counts towards the initial value from the state of counting upwards and the count value of the D-FF's 127 to 130 approaches the initial value. Explanation thereof will be omitted.

In this embodiment, when the counter 219 counts towards the initial value from the state of counting upwards, after the count value reaches (1, 1, 1, 0), it is reversed to (0, 0, 0, 1). It is also possible, however, to directly turn the count value to (0, 0, 0, 1). For example, the outputs Q of the D-FF's 127 to 130 may be temporarily inverted during the change of the sate of the clock pulsed so as to make the inversion signal agree with the output (carry) of the AND gate 141.

In addition, it is possible to provide a gate circuit to which the output Q of each of the D-FF's 127 to 130 is input so as to detect the time at which the count value has returned to (0, 0, 0, 1).

Although a 2-channel stereo system is cited as an example in these embodiments, the present invention is applicable to not only a 2-channel stereo system but also a multi-channel stereo system such as a 4-channel stereo system.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A balance control circuit for controlling the balance between signals transmitted from at least two channels, the balance control circuit comprising:

(A) an attenuator disposed in each of the channels so as to attenuate the signal transmitted thereto with a variable amount of attenuation;

(B) a timing signal generator for generating a timing signal which determines a balance control period for adjustment of the attenuation by the attenuators;

(C) an oscillator which operates in accordance with the timing signal;

(D) a counter for counting the output signals of the oscillator as clock pulses;

(E) a decoder for decoding the count value and supplying a signal for controlling the amount of attenuation to the attenuator; and (F) a direction signal generator for generating a direction signal which determines whether the counter must count upwards or count downwards in order to determine in which attenuator the amount of attenuation is increased and in which attenuator the amount of attenuation is decreased, and supplying the direction signal to the counter.

2. A balance control circuit according to claim 1, wherein the direction signal generator includes:

a level ratio signal generator for generating a signal having a level ratio proportional to the level ratio of the signals which are transmitted from the channels; and a comparator for comparing the output signal of the level ratio signal generator and a reference voltage.

3. A balance control circuit according to claim 1, wherein the decoder outputs signals having the reverse phases from each other to a pair of attenuators so that when the amount of attenuation in one attenuator is increased, the amount of attenuation in the other attenuator may be decreased.

4. A balance control circuit according to claim 1, wherein each attenuator includes:

a plurality of resistors which are connected in series between the signal path for transmitting the corresponding signal and the ground; and a plurality of gates for connecting one end of each resistor and the signal path; and the gate is so controlled as to be opened or closed in accordance with the output of the decoder, thereby controlling the amount of attenuation.

5. A balance control circuit according to claim 1, wherein the timing signal generator is responsive to a circuit which compares the signals output from the attenuators and generates a ratio signal, the timing signal generator judging whether or not the ratio signal is in a predetermined range.

6. A balance control circuit according to claim 1, further comprising:

a completion detector for detecting the end of balance control carried out by the control of the amounts of attenuation of the attenuators; and a controller for controlling the generation of the timing signal in accordance with the output signal of the completion detector.

7. A balance control circuit according to claim 6, wherein the completion detector generates a control completion signal when the direction signal output is a repetition of alternate signals for upward and downward directions.

8. A balance control circuit according to claim 6, wherein the controller includes:

an unbalance signal generator for detecting a disturbance of the balance from the levels of the signals output from the plurality of attenuators and generating an unbalance signal;

an OR gate to which the unbalance signal and the control completion signal are input so as to obtain the logical sum thereof; and an AND gate to which the output of the OR gate and the timing signal are input so as to obtain the logical product thereof.

9. A balance control circuit for controlling the balance between signals transmitted from at least two channels, the balance control circuit comprising:

(A) an attenuator disposed in each of the channels so as to attenuate the signal transmitted thereto with a variable amount of attenuation;

(B) a timing signal generator for generating a timing signal which determines a balance control period for adjustment of the attenuation by the attenuators;

(C) an oscillator the oscillation frequency of which varies in accordance with the timing signal;

(D) an up down type counter for counting the output signals of the oscillator as clock pulses upwards or downward from an initial value which is an intermediate value of the counting range;

(E) a direction signal generator for detecting the level of the output signal of each attenuator and generating a direction signal which determines whether the counter must count upwards or count downwards;

(F) a direction judging circuit for judging whether the current count value of the counter was obtained by counting upwards from the initial value or counting downwards from the initial value;

(G) a switch for selecting either the output signal of the direction generator or the output signal of the direction judging circuit in accordance with the timing signal and supplying the selected signal to the counter as a signal which determines whether the counter must count upwards or downwards; and (H) a decoder for decoding the count value and supplying a signal for controlling the amount of attenuation to the attenuators.

10. A balance control circuit according to claim 9, further comprising:

an initial value detector for detecting that the count value of the counter has changed from a value other than the initial value to the initial value; and an inhibitor for inhibiting the counting operation of the counter in accordance with the output of the initial value detector.

11. A balance control circuit according to claim 9, wherein the direction judging circuit judges the direction of counting on the basis of the most significant bit (MSB) of the count value of the counter.

12. A balance control circuit according to claim 10, wherein the initial value detector detects that the count value of the counter has changed from a value other than the initial value to the initial value by detecting that the most significant bit of the count value of the counter has changed.

* * * * *